United States Patent
Tsai et al.

(10) Patent No.: US 8,435,824 B2
(45) Date of Patent: May 7, 2013

(54) BACKSIDE ILLUMINATION SENSOR HAVING A BONDING PAD STRUCTURE AND METHOD OF MAKING THE SAME

(75) Inventors: Shuang-Ji Tsai, Guiren Township, Tainan County (TW); Dun-Nian Yaung, Taipei (TW); Jeng-Shyan Lin, Tainan (TW); Jen-Cheng Liu, Hsin-Chu (TW); Wen-De Wang, Minsyong Township, Chiayi County (TW); Yueh-Chiou Lin, Longjing Shiang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/177,686

(22) Filed: Jul. 7, 2011

(65) Prior Publication Data

US 2013/0009270 A1    Jan. 10, 2013

(51) Int. Cl.
*H01L 21/00*    (2006.01)
*H01L 31/00*    (2006.01)

(52) U.S. Cl.
USPC ............................................. 438/65; 257/460

(58) Field of Classification Search .................. 257/292, 257/432, 447, 460; 438/64–68
See application file for complete search history.

(56) References Cited

U.S. PATENT DOCUMENTS

| | | | |
|---|---|---|---|
| 6,872,584 B2* | 3/2005 | Nakashiba | 438/22 |
| 7,101,726 B2* | 9/2006 | Yamamoto et al. | 438/69 |
| 7,208,832 B2 | 4/2007 | Yamagata | |
| 7,675,101 B2* | 3/2010 | Hwang | 257/292 |
| 7,714,403 B2* | 5/2010 | Lee et al. | 257/432 |
| 2011/0024866 A1 | 2/2011 | Tseng et al. | |

FOREIGN PATENT DOCUMENTS

| | | |
|---|---|---|
| JP | 2008066440 | 3/2008 |
| KR | 10-2004-0107442 | 12/2004 |

OTHER PUBLICATIONS

Unpublished U.S. Appl. No. 13/112,828 entitled "Semiconductor Device Having a Bonding Pad and Shield Structure and Method of Manufacturing the Same", filed May 20, 2011.
Unpublished U.S. Appl. No. 13/112,755 entitled "Semiconductor Device Having a Bonding Pad and Method of Manufacturing the Same", filed May 20, 2011.
Korean Patent Office, Office Action dated Oct. 2, 2012, Delivery No. 9-5-2012-05889939389, 9 pages with English translation.

* cited by examiner

*Primary Examiner* — Calvin Lee
(74) *Attorney, Agent, or Firm* — Haynes and Boone, LLP (57) ABSTRACT

The present disclosure provides one embodiment of a semiconductor structure. The semiconductor structure comprises a device substrate having a front side and a back side; an interconnect structure disposed on the front side of the device substrate; and a bonding pad connected to the interconnect structure. The bonding pad comprises a recessed region in a dielectric material layer; a dielectric mesa of the dielectric material layer interposed between the recessed region; and a metal layer disposed in the recessed region and on the dielectric mesa.

20 Claims, 9 Drawing Sheets

BACKSIDE ILLUMINATION SENSOR HAVING A BONDING PAD STRUCTURE AND METHOD OF MAKING THE SAME

CROSS-REFERENCE TO RELATED APPLICATIONS

The present application is related to the following commonly-assigned U.S. patent applications, the entire disclosures of which are incorporated herein by reference: U.S. patent application Ser. No. 13/112,828, entitled, "Semiconductor Device Having a Bonding Pad and Shield Structure and Method of Manufacturing the Same;" and U.S. patent application Ser. No. 13/112,755, entitled, "Semiconductor Device Having a Bonding Pad and Method of Manufacturing the Same."

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Pads used for various applications, such as probe and/or wire bonding (generally referred to hereafter as a bonding pad) often have separate requirements than other features of an IC. For example, a bonding pad must have sufficient size and strength to withstand physical contact due to such actions as probing or wire bonding. There is often a simultaneous desire to make features relatively small (both in size and in thickness). For example, in applications such as a complementary metal-oxide semiconductor (CMOS) image sensor, it is often desired to have one or more relatively thin metal layers, for example a metal layer of aluminum copper (AlCu). A problem with thin metal layers is that the bond pads formed in these layers can exhibit peeling or other defects. A need therefore exists to accommodate the various requirements of these features.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may comprise embodiments in which the first and second features are formed in direct contact, and may also comprise embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present invention.

Examples of devices that can benefit from one or more embodiments of the present invention are semiconductor devices with image sensors. Such a device, for example, is a back-side illuminated (BSI) image sensor device. The following disclosure will continue with this example to illustrate various embodiments of the present invention. It is understood, however, that the invention should not be limited to a particular type of device, except as specifically claimed.

Figure 1:
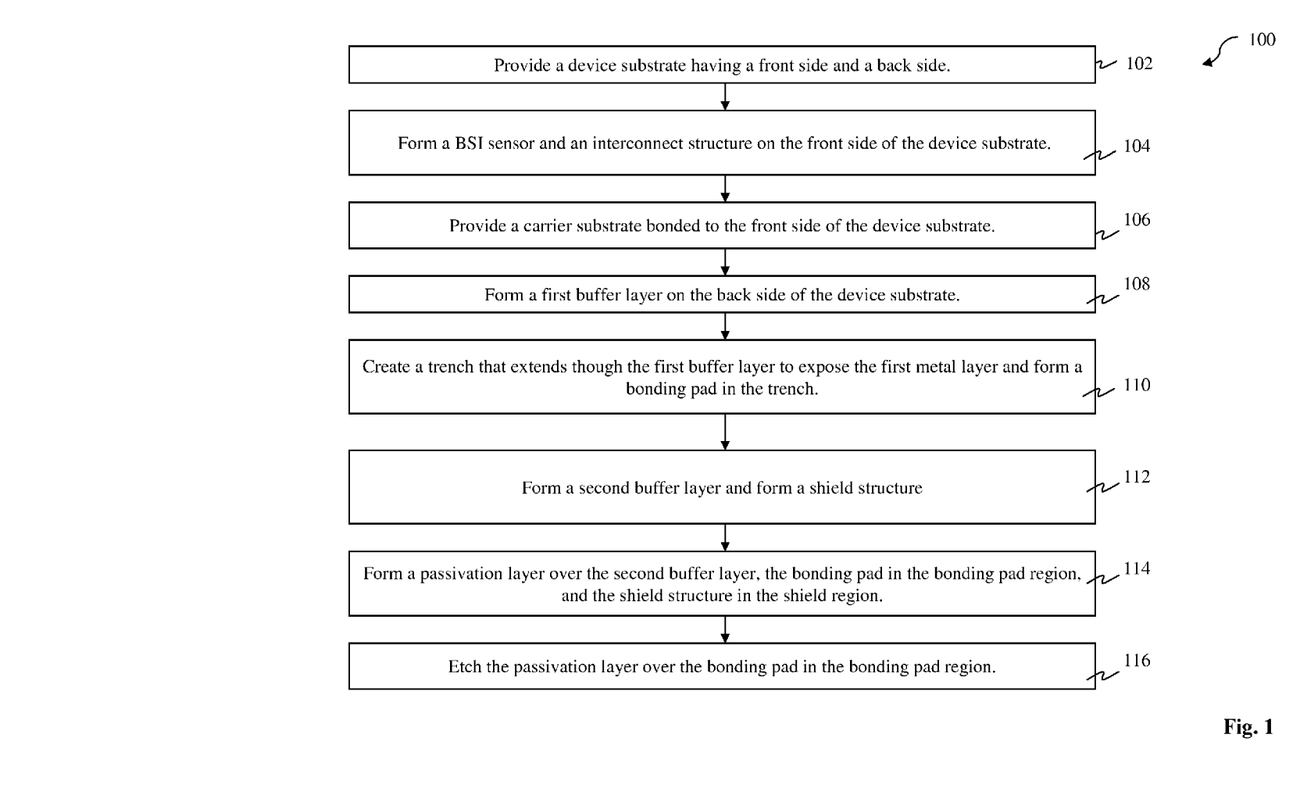
FIG. 1 is a flowchart illustrating a method of forming a semiconductor structure according to various aspects of the present disclosure.

FIG. 1 is a flowchart of a method 100 for making a semiconductor structure having one or more backside illuminated sensors (BSIs). The method 100 begins with step 102 in which a device substrate having a front side and a back side is provided. The method 100 continues with step 104 in which one or more radiation sensors are formed in the device substrate. Also, at step 104 an interconnect structure and a passivation layer are formed on the device substrate. The interconnect structure comprises a first metal layer and may comprise a plurality of metal layers with the first metal layer adjacent to the device substrate. The method 100 continues with step 106 in which a carrier substrate is provided and bonded to the front side of the device substrate. The method 100 continues at step 108 in which a first buffer layer, which may be transparent, is formed on the back side of the device substrate. The method 100 continues at step 110 in which an opening (or a trench) is formed in a bonding region, the opening extending through the first buffer layer such that the opening reaches and exposes a metal layer of the interconnect structure, such as a first metal layer of the interconnect structure. Than a bonding pad is formed in the opening within the bonding region and the bonding pad partially fills in the opening and couples the metal layer of the interconnect structure. The method 100 continues at step 112 in which a second buffer layer is formed on the first buffer layer and the bonding pad. Then a shield structure is formed in a shield region over the second buffer layer. The method 100 continues at step 114 in which a passivation layer is formed over the second buffer layer, the bonding pad in the bonding region, and the shield structure in the shield region. The method 100 continues at step 116 in which an etch process removes the passivation layer and the second buffer layer over the bonding pad in the bonding region. Particularly, the opening in the bonding region is designed and configured such that the opening defines a dielectric mesa interposed between various portions of the opening. The bonding pad comprises a metal layer disposed in the opening and on the dielectric mesa. Additional steps can be provided before, during, and after the method 100, and some of the steps described can be replaced or eliminated for other embodiments of the method. The discussion that follows illustrates various embodiments of a semiconductor device that can be fabricated according to the method 100 of FIG. 1.

FIGS. 2 to 7 are diagrammatic sectional side views of one embodiment of a semiconductor structure that is a back-side illuminated (BSI) image sensor device 200 at various stages of fabrication according to the method 100 of FIG. 1. The image sensor device 200 comprises pixels (sensors) for sensing and recording an intensity of radiation (such as light) directed toward a back-side of the image sensor device 200. The image sensor device 200 may comprise a complimentary metal oxide semiconductor (CMOS) image sensor (CIS), a charge-coupled device (CCD), an active-pixel sensor (APS), or a passive-pixel sensor. The image sensor device 200 further comprises additional circuitry and input/outputs that are provided adjacent to the sensors for providing an operation environment for the sensors and for supporting external communication with the sensors. It is understood that FIGS. 2 to 7 have been simplified for a better understanding of the inventive concepts of the present disclosure and may not be drawn to scale.

Figure 2:
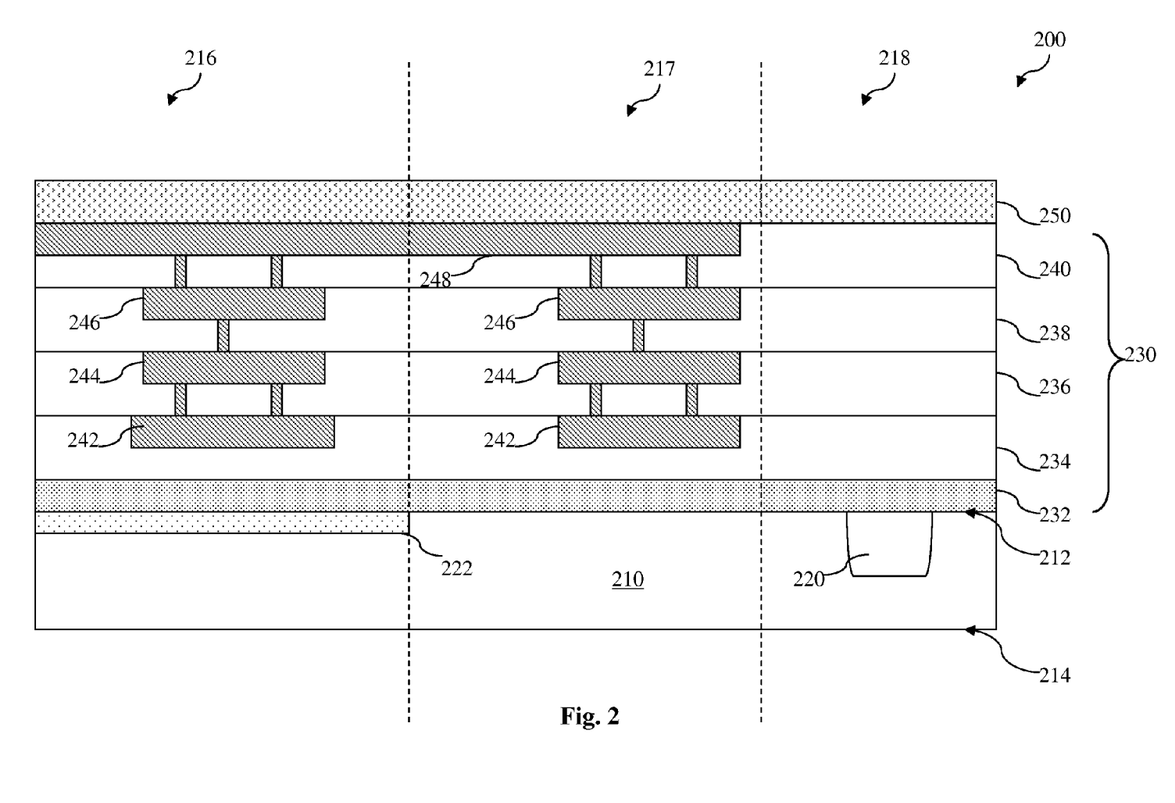
FIGS. 2 to 5, 7 and 8 illustrate diagrammatic cross-sectional side views of one embodiment of a semiconductor structure at various stages of fabrication according to the method of FIG. 1.

With reference to FIG. 2, the BSI image sensor device 200 comprises a device substrate 210. The device substrate 210 has a front side 212 and a back side 214. The device substrate 210 is a silicon substrate doped with a p-type dopant such as boron (for example a p-type substrate). Alternatively, the device substrate 210 could comprise another suitable semiconductor material. For example, the device substrate 210 may be a silicon substrate that is doped with an n-type dopant such as phosphorous or arsenic (an n-type substrate). The device substrate 210 could comprise other elementary materials such as germanium and diamond. The device substrate 210 could optionally comprise a compound semiconductor and/or an alloy semiconductor. Further, the device substrate 210 could comprise an epitaxial layer (epi layer), may be strained for performance enhancement, and may comprise a silicon-on-insulator (SOI) structure.

The device substrate 210 comprises a bonding region 216, a shield region 217, and a radiation-sensing region 218. The broken lines in FIG. 2 designate an approximate boundary between the regions. The radiation-sensing region 218 is a region of the device substrate 210 where radiation-sensing devices will be formed. The radiation-sensing region 218, for example, comprises (radiation) sensor 220. The sensor 220 is operable to sense radiation, such as an incident light (thereafter referred to as light), that is projected toward the back side 214 of the device substrate 210, therefore referred to as back side illumination (BSI) sensor. The sensor 220 comprises a photodiode in the present embodiment. Other examples of the backside illuminated sensors 104 may comprise pinned layer photodiodes, photogates, a complimentary metal-oxide-semiconductor (CMOS) image sensor, a charged coupling device (CCD) sensor, an active sensor, a passive sensor, and/or other types of devices diffused or otherwise formed in the semiconductor substrate 210. As such, the sensors 220 may comprise conventional and/or future-developed image sensing devices. The sensor 220 my additionally comprise reset transistors, source follower transistors, and transfer transistors. Further, the sensor 220 may be varied from one another to have different junction depths, thicknesses, and so forth. For the sake of simplicity, only sensor 220 is illustrated in FIG. 2, but it is understood that any number of sensors may be implemented in the device substrate 210. Where more than one sensor is implemented, the radiation-sensing region comprises isolation structures that provide electrical and optical isolation between the adjacent sensors.

The shield region 217 is a region where one or more shield structure of the BSI image sensor device 200 will be formed in a later processing state. The bonding region 216 is a region where one or more bonding pads of the BSI image sensor device 200 will be formed in a later processing stage, so that electrical connections between the BSI image sensor device 200 and external devices may be established. It is also understood that regions 216, 217, and 218 extend vertically above and below the device substrate 210.

Referring back to FIG. 2, a shallow trench isolation (STI) layer (or STI features) 222 is formed over the front side 212 of the BSI image sensor device 200. The STI layer 222 may comprise suitable dielectric material, such as silicon oxide. The STI layer 222 may be formed by a suitable technique known in the art. For example, the STI features may be formed by a set of processes including patterning the semiconductor layer by a conventional photolithography, etching the semiconductor layer by a plasma etching process to form various trenches, and filling the trenches by a dielectric material, such as silicon oxide by a chemical vapor deposition (CVD) process. Alternatively, the trenches may be filled in by a process such as chemical vapor deposition (CVD), high density plasma chemical vapor deposition (HDPCVD), a plasma enhanced chemical vapor deposition (PECVD), combinations thereof, or other suitable processes.

An interconnect structure 230 is formed over the front side of the device substrate 210. The interconnect structure 230 comprises a plurality of conductive layers embedded in dielectric material layers. The plurality of conductive layers provide interconnections between the various doped features, circuitry, and input/output of the image sensor device 200. The plurality of conductive layers comprise metal lines in metal one, metal two and so on to the top-most layer. The plurality of conductive layers further comprise contacts for coupling the doped regions to the metal lines in metal one. The plurality of conductive layers further comprise vias to couple adjacent metal layers. In the present embodiment, the interconnect structure 230 comprises an interlayer dielectric (ILD) layer 232 and a plurality of intermetal dielectric (IMD) layers 234, 236, 238, and 240. The ILD layer 232 and the plurality of intermetal dielectric (IMD) layers 234, 236, 238, and 240 layers may comprise suitable dielectric material. For example, in the present embodiments, the ILD layer 232 and the plurality of intermetal dielectric (IMD) layers 234, 236, 238, and 240 comprises a low dielectric constant (low-k) material, the material having a constant lower than that of thermal silicon oxide. In other embodiments, the ILD layer 232 and the plurality of intermetal dielectric (IMD) layers 234, 236, 238, and 240 comprises a dielectric material. The dielectric material may be formed by CVD, HDPCVD, PECVD, combinations thereof, or other suitable processes.

Each of the IMD layers 234, 236, 238, and 240 comprises contacts, vias and a metal layer 242, 244, 246, and 248, respectively. For the purposes of illustration, only four IMD layers are shown in FIG. 2, it being understood that any number of IMD layers may be implemented and that the IMD layers as illustrated are merely exemplary, and the actual positioning and configuration of the metal layers and vias/contacts may vary depending on design needs.

The interconnect structure 230 may comprise conductive materials such as aluminum, aluminum/silicon/copper alloy, titanium, titanium nitride, tungsten, polysilicon, metal silicide, or combinations thereof, formed by a process including physical vapor deposition, CVD, HDPCVD, PECVD, combinations thereof, or other suitable processes. Other manufacturing techniques to form the interconnect may comprise photolithography processing and etching to pattern the conductive materials for vertical connection (for example, vias/contacts) and horizontal connection (for example, metal layers). Alternatively, a copper multilayer interconnect may be used to form the metal patterns. The copper interconnect structure may comprise copper, copper alloy, titanium, titanium nitride, tantalum, tantalum nitride, tungsten, polysilicon, metal silicide, or combinations thereof. The copper interconnect may be formed by damascene technique including dielectric deposition, etching, deposition and polishing. The deposition may comprise sputtering, plating, CVD or other suitable processes.

Still referring to FIG. 2, in the present embodiment, a passivation layer 250 is formed over the interconnect structure 230 and in direct contact with the nth metal layer 248. The passivation layer 250 may comprise any suitable dielectric material. In the present embodiment, the passivation layer 250 comprises silicon oxide, silicon nitride, silicon oxynitride or combination thereof. The passivation layer 250 may be formed by a suitable technique, such as CVD. The passivation layer 250 may be planarized to form a smooth surface by a chemical mechanical polishing (CMP) process.

Figure 3:
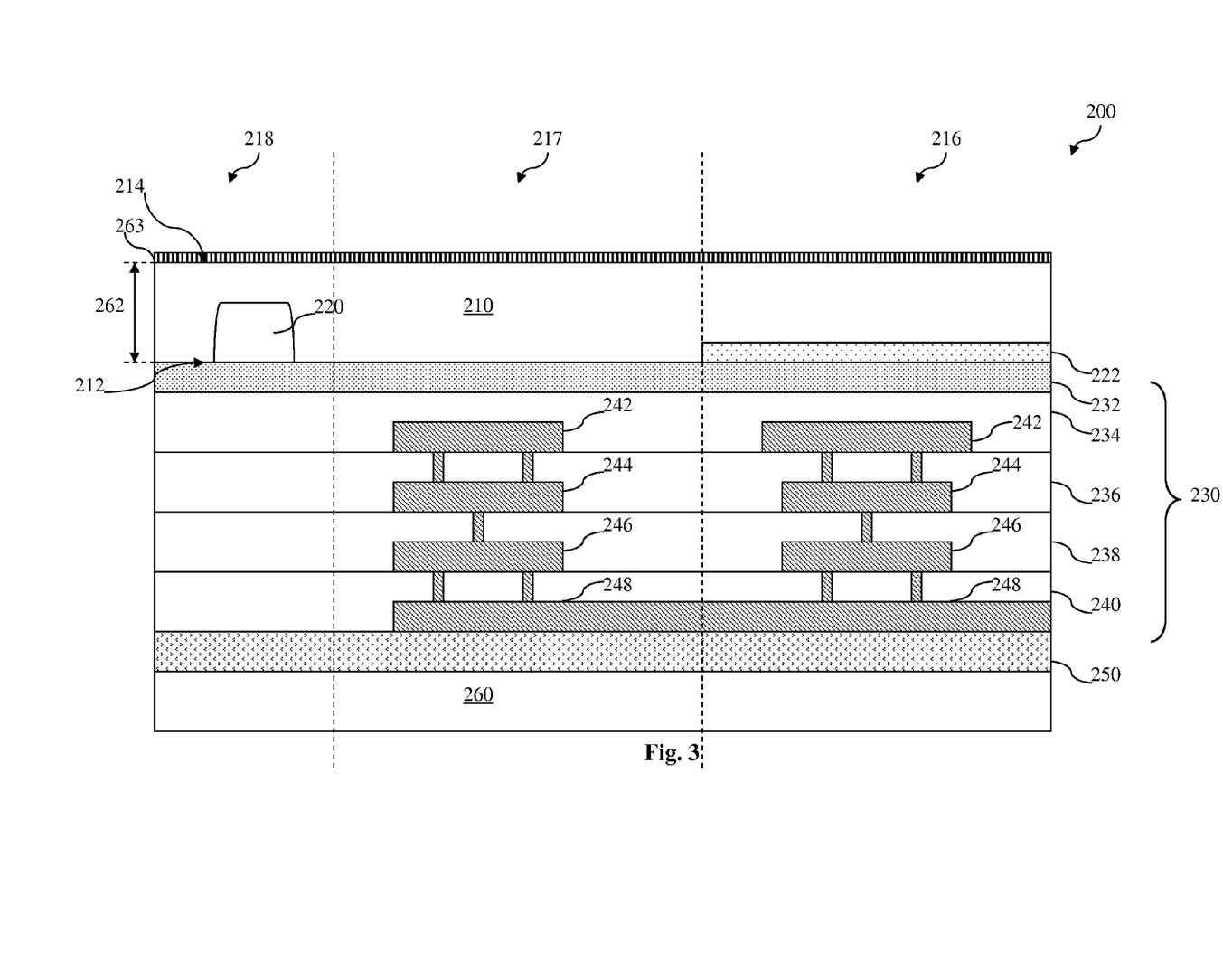

With reference to FIG. 3, a carrier substrate 260 is bonded with the device substrate 210 from the front side, so that processing the back side 214 of the device substrate 210 can be performed. The carrier substrate 260 in the present embodiment is similar to the device substrate 210 and comprises a silicon material. Alternatively, the carrier substrate 260 may comprise a glass substrate or another suitable material. The carrier substrate 260 may be bonded to the device substrate 210 by molecular forces—a technique known as direct bonding or optical fusion bonding—or by other bonding techniques known in the art, such as metal diffusion, eutectic bonding or anodic bonding. The passivation layer 250 provides electrical isolation from the carrier substrate 260. The carrier substrate 260 provides protection for the various features formed on the front side 212 of the device substrate 210, such as the sensor 220. The carrier substrate 260 also provides mechanical strength and support for processing the back side 214 of the device substrate 210.

After bonding, the device substrate 210 and the carrier substrate 260 may optionally be annealed to enhance bonding strength. A thinning process is performed to thin the device substrate 210 from the back side 214. The thinning process may comprise a mechanical grinding process and a chemical thinning process. A substantial amount of substrate material may be first removed from the device substrate 210 during the mechanical grinding process. Afterwards, the chemical thinning process may apply an etching chemical to the back side 214 of the device substrate 210 to further thin the device substrate 210 to a thickness 262. In one example, the thickness 262 of the device substrate 210 is in the range of about 3 microns to about 6 microns. It is also understood that the particular thicknesses disclosed in the present disclosure serves as a mere example and that other thicknesses may be implemented depending on the type of application and design requirements of the image sensor device 200. Still referring to FIG. 3, one or more material layers may be formed on the back side 214 of the device substrate 210. In one example, an antireflective coating (ARC) layer 263 may be formed over the back side 214 of the device substrate 210.

Figure 4:
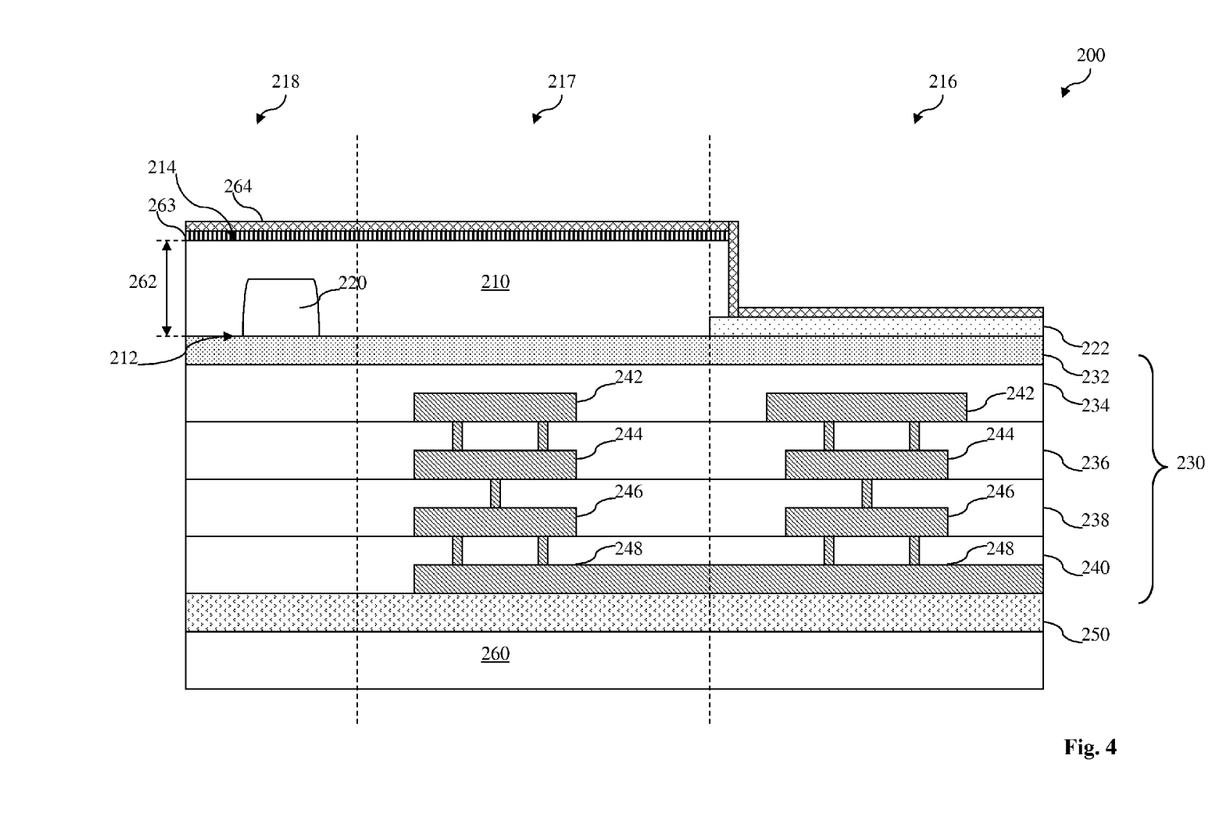

FIG. 4 illustrates patterning the device substrate by removing portions of the device substrate 210 to form scribe lines and the bonding region 216, according to an embodiment of the present disclosure. The patterning of the device substrate 210 comprises a lithography patterning process. An exemplary photolithography process may comprise photoresist patterning, etching, and photoresist stripping. The photoresist patterning may further comprise processing steps of photoresist coating, soft baking, mask aligning, exposing pattern, post-exposure baking, developing photoresist, and hard baking. Photolithography patterning may also be implemented or replaced by other proper methods such as maskless photolithography, electron-beam writing, ion-beam writing, and molecular imprint.

In one embodiment, a patterned photoresist layer is formed on the ARC layer 264. The patterned photoresist layer comprises various openings, defining the scribe lines and bonding region 216. The ARC layer 263 and the device substrate 210 are etched in the bonding region 216 (and scribe region as well) using the patterned photoresist layer as an etch mask, defining the bonding region 216 (and the scribe line). Alternatively, a hard mask layer may be used to pattern the device substrate 210 and define the bonding region 216 and the scribe line.

The etching process may comprise any suitable etching technique, such as dry etching. The etching process may be executed such that the STI layer 222 is exposed. In one example, the etching process is designed with a proper etchant for selective etching and uses the STI layer 222 as a stop etch layer. The patterned photoresist layer protects portions of the ARC layer and the device substrate 210 therebelow in the etching process to remove material from the ARC layer and the device substrate 210. It is understood that the photoresist mask is removed away by wet stripping or plasma ashing after the removal of the material.

Still referring to FIG. 4, a buffer layer 264 is formed over the back side 214 of the device substrate 210 and the STI layer 222. The buffer layer 264 may be transparent. The buffer layer 264 may comprise any suitable dielectric material. In the present embodiment, the buffer layer 264 comprise silicon oxide and may be formed by a process such as CVD, or other suitable techniques. In other embodiments, the buffer layer 264 may have a suitable thickness.

Figure 5:
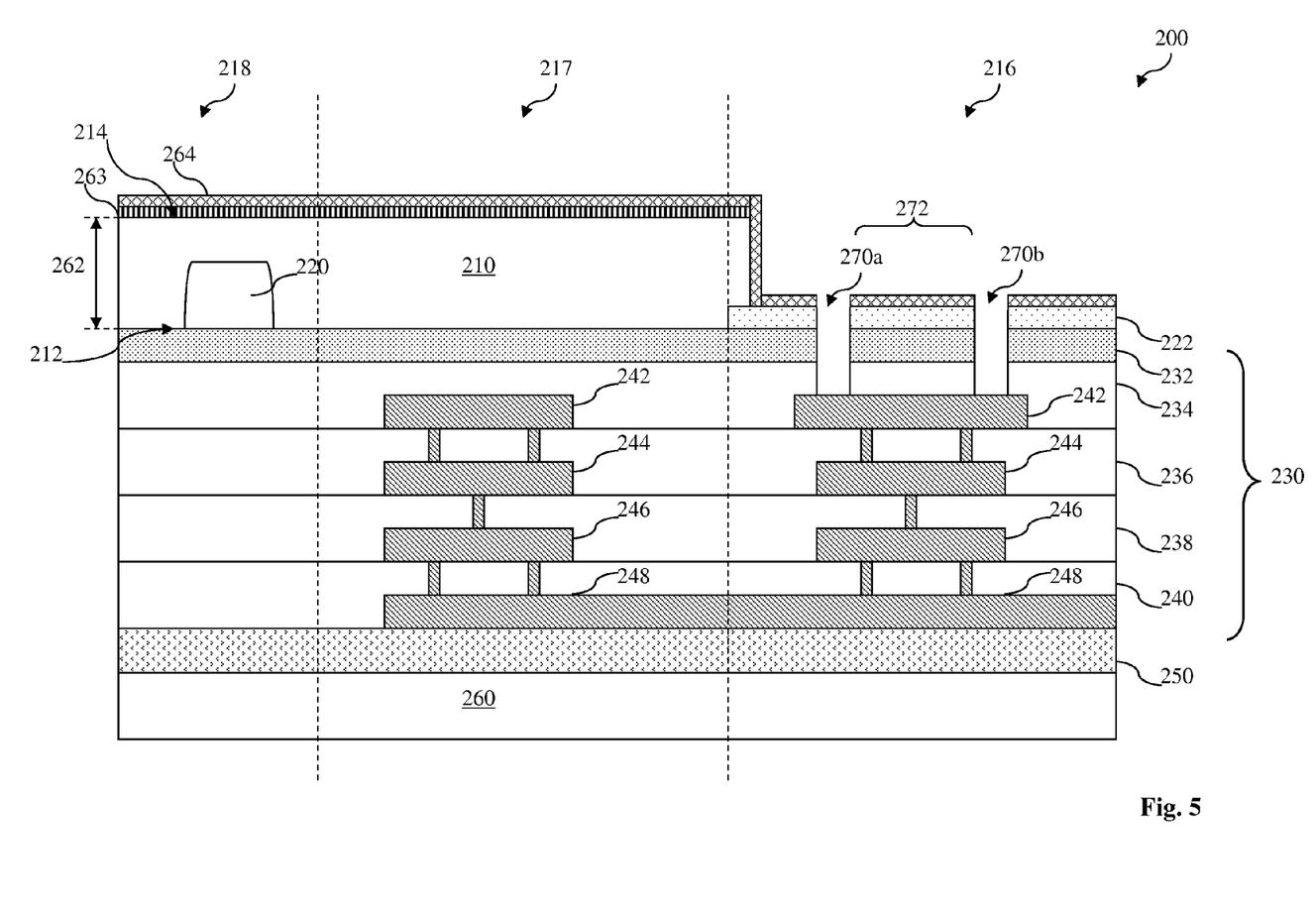

Referring now to FIG. 5, an opening (or recessed region) 270 is formed in the bonding region 216 of the device substrate 210. The opening 270 extends through the buffer layer 264, STI layer 222 and the ILD 232, reaching a metal feature of the interconnect structure 230, such as a metal feature in the metal one layer of the interconnect structure 230 in the bonding region 216 such that the metal feature is exposed from the back side 214. Alternatively, the opening 270 may extend through at least a portion of the interconnect structure such that a metal layer, such as the metal two layer, the metal three layer, . . . or the top metal layer, is exposed within the opening 270. The opening 270 is formed by an etching process, such as a lithography process and an etching process. The etching process may comprise a suitable technique such as dry etching, wet etching or combination. The etching process may comprise multiple etching steps. For example, the etching process comprises a first etching step to effectively etch silicon oxide and a second etching process to effectively etch silicon material. In another example, the second etching step etches the silicon using the etched buffer layer 264 (or additionally STI layer 222 and the ILD layer 232) as an etch mask. Alternatively, a hard mask is used during the first etching step to etch the buffer layer.

Particularly, the opening 270 is designed to comprise a first portion 270a and a second portion 270b such that a dielectric mesa 272 is formed and configured between the first portion and second portion of the opening 270. The first and second portions of the opening 270 may be connected or disposed away according to various embodiments. In the present example, the first portion 270a and the second portion 270b of the opening 270 are configured along a first direction and spaced away from each other along a second direction perpendicular to the first direction.

Figures 6A, 6B, 6C:
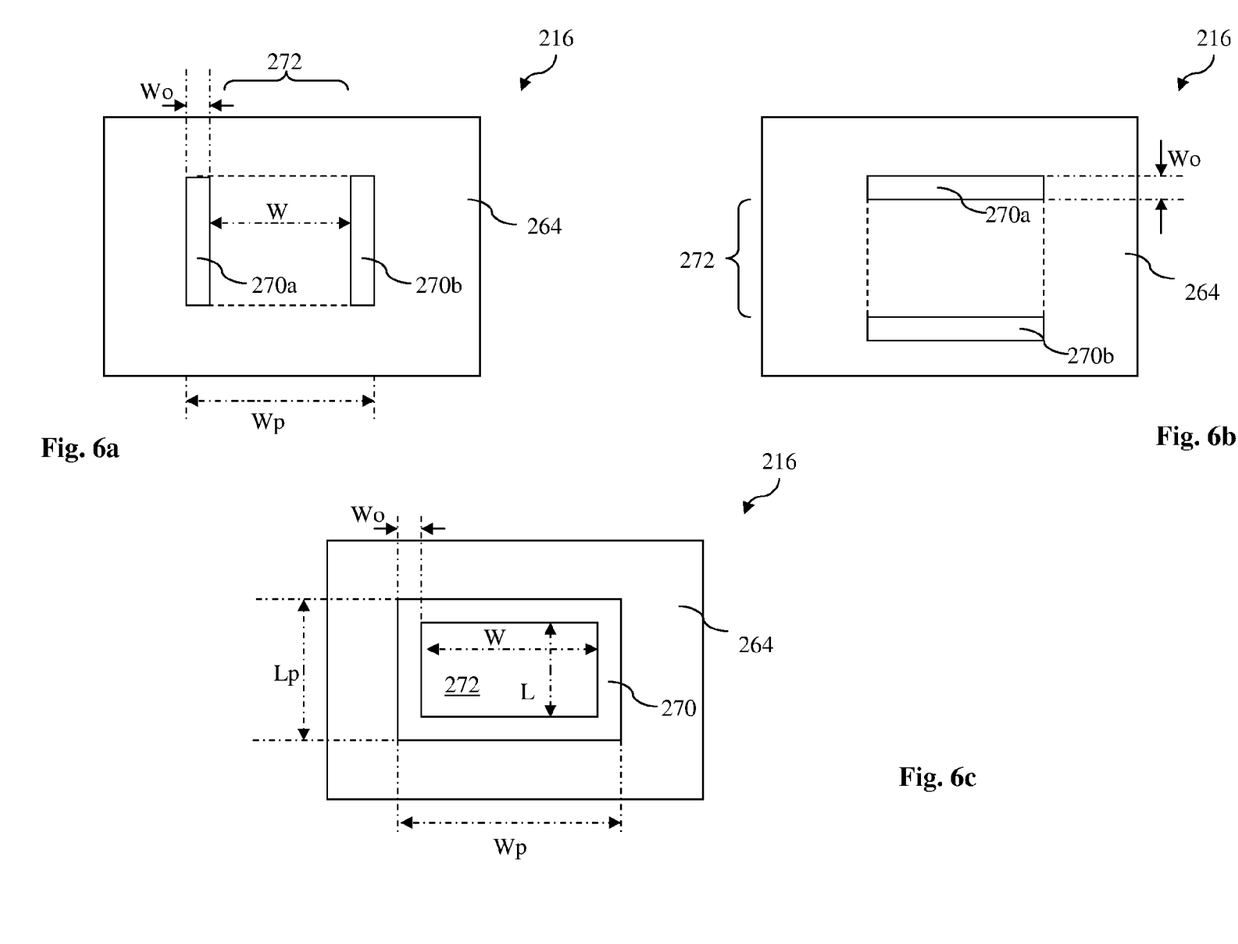
FIGS. 6a, 6b and 6c illustrate diagrammatic top views of various embodiments of a semiconductor structure at various stages of fabrication according to the method of FIG. 1.

FIGS. 6a, 6b and 6c illustrate various embodiments of the opening 270 in the top view. FIGS. 6a, 6b and 6c only comprise bonding region 216 for simplicity. In one embodiment with reference to FIG. 6a, the opening 270 comprises a first portion (or a first trench) 270a and a second portion (or a second trench) 270b aligned in a first direction and spaced away from each other in a second direction perpendicular to the first direction. The dielectric mesa 272 comprises a width W. The first and second portions 270a/270b of the opening 270 defines a second dimension Wp. Wp is greater than W. In one example, W is greater than about 10 micron. The top material layer of the dielectric mesa 272 is the buffer layer 264 in the present embodiment. Furthermore, the metal layer 242 is exposed in the opening 270 according to the Present embodiment. Alternatively, the opening 270 may extend through at least a portion of the interconnect structure such that a metal layer, such as the metal two layer, the metal three layer, . . . or the top metal layer, is exposed within the opening 270. It is understood that the depth of the opening 270 varies depending on the design and other considerations.

In another embodiment with reference to FIG. 6b, the opening 270 comprises a first portion (or a first trench) 270a and a second portion (or a second trench) 270b aligned in the second direction and spaced away from each other in the first direction perpendicular to the second direction. The opening 270 of FIG. 6b is similar to FIG. 6a but with different orientation.

In another embodiment with reference to FIG. 6c, the opening 270 is a continuous structure surrounding the dielectric mesa 272. In a particular example, the opening 270 comprises a first portion and a second portion aligned in a first direction and spaced away from each other in a second direction perpendicular to the first direction. The opening 270 further comprises a third portion and a fourth portion aligned in the second direction and spaced away from each other in the first direction. The first, second, third and fourth portions of the opening 270 constitute a continuous opening that defines the dielectric mesa 272 inside. In the present embodiment as illustrated in FIG. 6c, the dielectric mesa 272 comprises a width W and a length L. In one example, each of W and L is greater than about 10 micron. The opening 270 comprises an opening width Wo less than the width W of the dielectric mesa 272. Furthermore, the opening 270 spans in a region with a width Wp and a length Lp, as illustrated in FIG. 6c. Wp is greater than W and Lp is greater than L. Similarly, Other examples of the bonding pad comprise similar dimensions.

Figure 7:
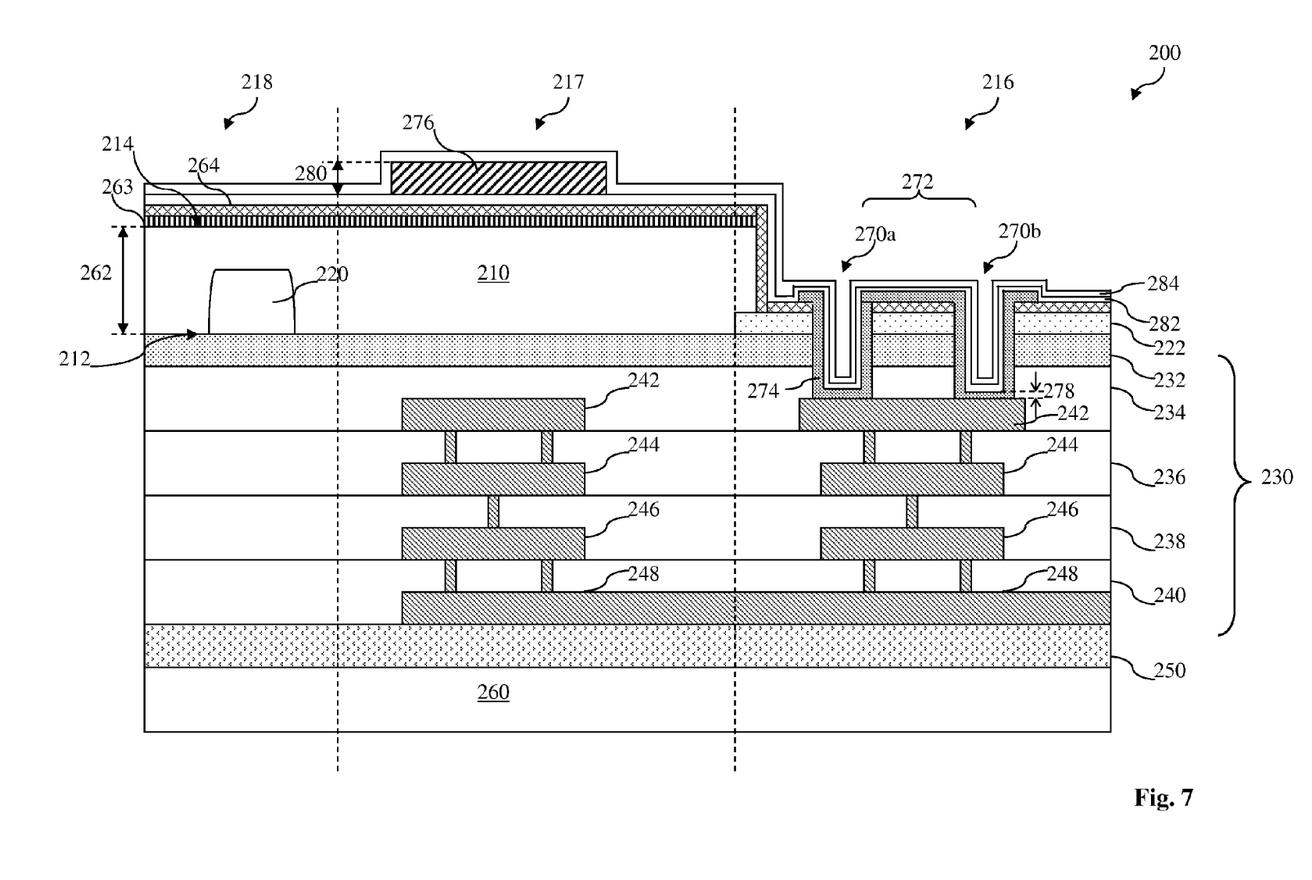

With reference to FIG. 7, a bonding pad 274 is formed on the device substrate in the bonding region 216. Particularly, the bonding pad 274 comprises a metal layer, such as aluminum copper alloy or other suitable metal, formed by deposition and patterning. In various examples, the deposition comprises PVD and the patterning comprises lithography process and etching. The bonding pad 274 is disposed on the dielectric mesa 272 and is further partially fills in the opening 270 in the bonding region 216 such that the bonding pad 274 directly contacts the interconnect structure, such as a metal feature of the metal one layer 242 in the interconnect structure.

A benefit of forming the bonding pad 274 with the dielectric mesa 272 interposed between the opening 270 and the bonding pad 274 extending from the metal feature of the interconnect structure 230 within the opening 270 to the dielectric mesa 272, in accordance with the present embodiment, is that a portion of the bonding pad in the opening and a portion of the bonding pad on the dielectric mesa integrate together with strong mechanical strength, thereby inhibiting cracking and peeling issues associated with the bonding pad. As such, when pressure is applied to the bonding pad 274, during subsequent testing (e.g., ball shearing test), or during a subsequent bonding process, the interconnect structure 230 and the bonding pad 274 integrated together will not yield to allow cracking and subsequent peeling of the bonding pad 274. Thus, the bonding pad 274 cracking and peeling issue is reduced or completely eliminated in the present embodiment.

As is illustrated in FIG. 7, the bonding pad 274 comes into contact with the metal feature of the metal one layer 242 within the opening 270. Therefore, electrical connections between the bonding pad 274 and device external to the image sensor device 220 may be established through the bonding pad 274. For the sake of simplicity, only four metal layers (242, 244, 246, and 248) are illustrated, but it is understood that any number of metal layers may be implemented in the interconnect structure 230. It is also understood that the bonding pad 274 may be extended to contact any metal layer of the interconnect structure, such as the top metal layer.

Still referring to FIG. 7, a buffer layer 282 may be formed over the bonding pad 274. The buffer layer 282 is disposed on the bonding pad 274 such that the bonding pad 274 is fully covered by the buffer layer 282. Thus, during subsequent metal etching, the buffer layer 282 functions as an etch stop layer to protect the bonding pad 274 from the etching. In the present embodiment, the buffer layer 282 is disposed on the bonding pad 274 and partially fills in the opening 270, in the bonding region 216. The buffer layer 282 may also be formed on the buffer layer 264 in the shield region 217 and the device region 218. The buffer layer 282 comprises silicon oxide or other suitable dielectric material suitable for etch stop during metal etch. The buffer layer 282 can be formed by deposition, such as CVD.

A shield structure 276 is formed on the buffer layer 282 in the shield region 217. In one embodiment, the shield structure 276 comprises the same metal material of the bonding pad 274. As illustrated in FIG. 7, the bonding pad 274 has a thickness 278 and the shield structure 276 has a thickness 280. As formed separately, the thicknesses 278 and 280 can be different and can be tuned according to respective purposes. In one example, the bonding pad has a thickness 278 and the shield structure thickness 280 may be in the range of about 500 Angstroms to about 10000 Angstroms. Furthermore, as the bonding pad 274 and the shield structure 276 are formed separately, the shield structure 276 may use a different material tuned for enhanced shielding effect. In other examples, the bonding pad 274 and shield structure 276 comprises a metal material, such as aluminum, copper, aluminum-copper, titanium, tantalum, titanium nitride, tantalum nitride, tungsten, or an alloy thereof. The shield structure 276 is formed by a procedure including deposition and patterning. The deposition uses a suitable technique in the art, such as PVD, CVD, combinations thereof, or other suitable techniques. The patterning comprises a lithography process and an etching process. During the etching process to pattern the shield structure 276, the buffer layer 282 serves as an etch stop layer to protect the bonding pad 274 from damaging.

A passivation layer 284 is formed on the buffer layer 282 and on the shield structure 276, and also partially fills in the opening 270. The passivation layer 284 may comprise any suitable dielectric material. In the present embodiment, the passivation layer 284 comprises silicon nitride, silicon oxide, silicon oxynitride, or combinations thereof. The passivation layer 284 may be formed by a suitable process, such as CVD.

Figure 8:
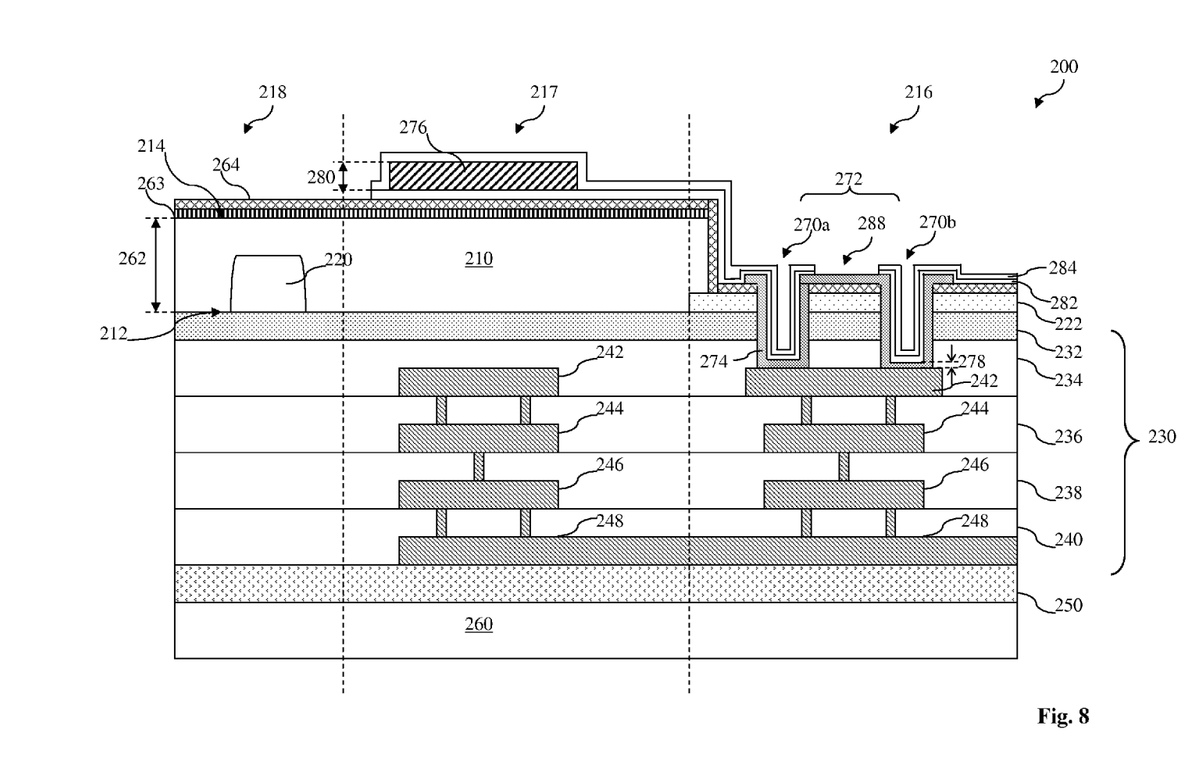

Referring now to FIG. 8, the buffer layer 282 and the passivation layer 284 are further patterned such that at least a portion of the bonding pad 274 on the dielectric mesa 272 is exposed for subsequent bonding process. Particularly, at least a portion of the passivation layer 284 and a portion of the buffer layer 282 on the dielectric mesa 272 are etched away using a suitable process, defining a pad opening 288 as illustrated in FIG. 8. In one embodiment, the buffer layer 282 and the passivation layer 284 are patterned such that the portions of both layers in the device region 218 are removed as well. In another embodiment, the process to pattern the passivation layer comprises lithography process and etching. In other example, the etching may comprise any suitable etching technique, such as a wet etching process or a dry etching process. In another embodiment, the etching comprises two etching steps, selectively etching the passiviation layer 284 and the buffer layer 284, respectively.

In another embodiment, the bonding pad 274 and the shield structure 276 are formed in a different order. The shield structure 276 is formed in the shield region 217. The buffer layer 282 is disposed on the substrate and over the shield structure 276 and is further patterned such that the bonding region is at least partially exposed. A patterning process, including etching, is applied to form the opening 270 and the dielectric mesa 272. The bonding pad 274 is thereafter formed on the dielectric mesa 272 and in the opening 270 by deposition and etching. The passivation layer 284 is deposited and patterned to form the pad opening 288 such that the bonding pad on the dielectric mesa 272 is exposed.

In yet another embodiment, the bonding pad 274 and the shield structure 276 are formed simultaneously in a same procedure. Particularly, a patterning process, including etching, is applied to form the opening 270 and the dielectric mesa 272. A metal layer is deposited and patterned to form both the bonding pad 274 and the shield structure 276. The buffer layer 282 may be further deposited on the substrate and the passivation layer 284 is deposited, such as, on the buffer layer 282. The buffer layer 282 and the passivation layer 284 are patterned such that the bonding pad on the dielectric mesa 272 is exposed. In another example, the buffer layer 282 and the passivation layer 284 are patterned such that portions of the buffer layer 282 and the passivation layer 284 in the device region 218 are additionally removed.

Figures 9A, 9B, 9C:
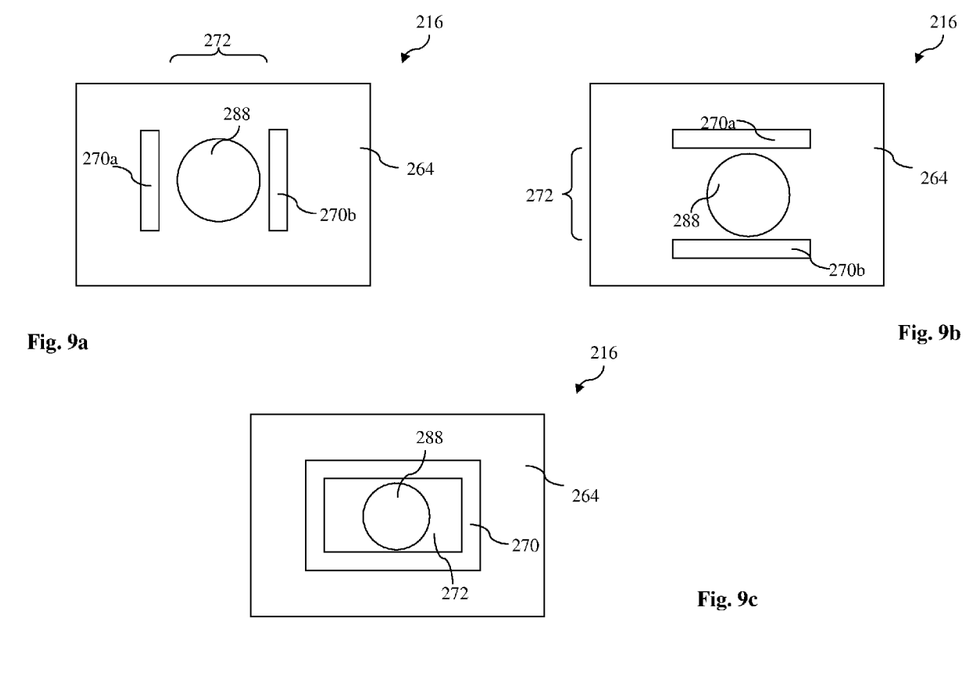
FIGS. 9a, 9b and 9c illustrate diagrammatic top views of various embodiments of a semiconductor structure at various stages of fabrication according to the method of FIG. 1.

The pad opening 288 is further illustrated in FIGS. 9a, 9b and 9c as top view according to various embodiments of the present disclosure. The pad opening 288 may be shaped to round or other suitable geometry for subsequent bonding process, such as attaching gold wire or solder ball, collectively referred to as bonding ball. Within the pad opening 288, the bonding pad 274 is exposed. Other areas in the bonding region 216, including the opening 270 (e.g. 270a and 270b), are covered by the passivation layer 284.

Though not illustrated, additional processing is performed to complete the fabrication of the image sensor device 200. For example, color filters are formed within the radiation-sensing region 218. The color filters may be positioned such that light is directed thereon and therethrough. The color filters may comprise a dye-based (or pigment based) polymer or resin for filtering a specific wavelength band of light, which corresponds to a color spectrum (e.g., red, green, and blue). Thereafter, micro-lenses are formed over the color filters for directing and focusing light toward specific radiation-sensing regions in the device substrate 210, such as sensor 220. The micro-lenses may be positioned in various arrangements and have various shapes depending on a refractive index of material used for the micro-lens and distance from a sensor surface. It is also understood that the device substrate 210 may also undergo an optional laser annealing process before the forming of the color filters or the micro-lenses.

Thus, provided is a semiconductor structure. The semiconductor structure comprises a device substrate having a front side and a back side; an interconnect structure disposed on the front side of the device substrate; and a bonding pad connected to the interconnect structure. The bonding pad comprises a recessed region in a dielectric material layer; a dielectric mesa of the dielectric material layer interposed between the recessed region; and a metal layer disposed in the recessed region and on the dielectric mesa.

In some embodiments, the recessed region comprises a trench formed in the dielectric material layer; the trench comprises a first portion and a second portion; and the dielectric mesa is interposed between the first and second portions of the trench. In another embodiment, the recessed region comprises a first trench and a second trench formed in the dielectric material layer; and the dielectric mesa is interposed between the first and second trenches. In another embodiment, the recessed region comprises a trench formed in the dielectric material layer and surrounding the dielectric mesa. The metal layer may comprise aluminum copper alloy. The metal layer contacts a metal feature of the interconnection structure within the recessed region. In yet another embodiment, the dielectric material layer comprises an interlayer dielectric layer (ILD) adjacent the metal feature; and a trench isolation feature adjacent the ILD. In yet another embodiment, the recessed region comprises a recess extending through the trench isolation feature and the ILD. The metal feature comprises a metal line in a metal one layer according to one embodiment. The dielectric material layer may comprise silicon oxide. The semiconductor structure may further comprise a bonding ball disposed on the metal layer and substantially landing on a portion of the metal layer within the dielectric mesa. In yet another embodiment, the semiconductor structure further comprises a radiation sensing region including a backside illumination sensor disposed in the front side of the device substrate, the backside illumination sensor being operable to sense radiation projected toward the radiation-sensing region from the back side of the device substrate; a radiation shield region adjacent the radiation sensing region and having a shield feature that comprises metal and is disposed on the back side of the device substrate; and a bonding region including the bonding pad. In yet another embodiment, the semiconductor structure further comprises a passivation layer disposed on the front side of the device substrate, wherein the passivation layer formed in the recessed region and dielectric mesa, and the passivation layer formed on the radiation shied feature.

Also provided is an alternative embodiment of a semiconductor structure. The semiconductor structure comprises a semiconductor substrate having a radiation sensing region and a bonding region and having a front side and a back side; a radiation sensor formed in back side of the semiconductor substrate within the radiation sensing region; an interconnect structure disposed on the front side of the semiconductor substrate and coupling the radiation sensor to a metal feature of the interconnect structure in the bonding region; a carrier substrate bonded to the front side of the semiconductor substrate with the interconnect structure sandwiched between the semiconductor substrate and the carrier substrate; an opening on the back side of the semiconductor substrate, wherein the opening is formed in the bonding region, extends through a dielectric material layer to metal feature of the interconnect structure, and defines a dielectric mesa of the dielectric material layer overlying the metal feature; and a metal layer partially filling the opening on the back side of the semiconductor substrate in the bonding region, wherein the metal layer has direct contact with the metal feature of the interconnect structure and further extends to the dielectric mesa.

In some embodiment, the semiconductor device further comprises a bonding ball landing on the metal layer and vertically aligned with the dielectric mesa, wherein the radiation sensor comprises a backside illumination imaging sensor. In other embodiments, the opening comprises a trench in the dielectric material layer; the trench comprises a first portion and a second portion; and the dielectric mesa is interposed between the first and second portions of the trench. In yet another embodiment, the opening comprises a first trench and a second trench in the dielectric material layer; and the dielectric mesa is interposed between the first and second trenches. In yet another embodiment, the semiconductor structure further comprises a passivation layer disposed on the backside of the semiconductor substrate, disposed in the opening of the dielectric layer and including an opening, wherein the opening of the passivation layer is aligned with the dielectric mesa and exposes the dielectric mesa.

Also provided is a method. The method comprises forming a radiation sensor in a front side of a device substrate; forming, on the front side of the device substrate, an interconnect structure coupled with the radiation sensor; bonding a carrier substrate to a back side of the device substrate; etching a dielectric material layer on the back side of the device substrate, forming an opening extending through a dielectric material layer to expose a metal feature of the interconnect structure, defining a dielectric mesa of the dielectric material layer surrounded by the opening; and forming a metal layer in the opening and on the dielectric mesa, resulting in a bonding pad, the bonding pad directly contacting the metal feature within the opening.

In some embodiment, etching the dielectric material layer comprises forming a first trench and a second trench interposed by the dielectric mesa. In another embodiment, the method further comprises forming a passivation layer on the metal layer, the passivation layer disposing in the opening; and patterning the passivation layer to at least partially expose the metal layer on the dielectric mesa. In yet another embodiment, the method further comprises forming a bonding metal on the passivation layer in the opening and on the metal layer over the dielectric mesa. In another embodiment, forming an interconnect structure comprises forming an interlayer dielectric (ILD) material on the device substrate and etching a dielectric material layer comprises etching the ILD material. In another embodiment, the method further comprises forming a metal shield feature on the device substrate approximate the radiation device. In yet another embodiment, forming a radiation sensor comprises forming the radiation sensor in a radiation-sensing region in a configuration such that the radiation sensor is operable to sense radiation projected toward the radiation-sensing region from the back side.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   forming a radiation sensor in a front side of a device substrate;
   forming, on the front side of the device substrate, an interconnect structure coupled with the radiation sensor;
   bonding a carrier substrate to a back side of the device substrate;
   etching a dielectric material layer on the back side of the device substrate, forming an opening extending through a dielectric material layer to expose a metal feature of the interconnect structure, thereby defining a dielectric mesa of the dielectric material layer surrounded by the opening, wherein etching the dielectric material layer comprises forming a first trench and a second trench interposed by the dielectric mesa; and
   forming a metal layer in the opening and on the dielectric mesa, resulting in a bonding pad, the bonding pad directly contacting the metal feature within the opening.

2. The method of claim 1, wherein the first and second trenches completely surround the dielectric mesa.

3. The method of claim 1, forming a shallow trench isolation structure over the dielectric material layer, and
   wherein forming the opening extending through the dielectric material layer to expose the metal feature of the interconnect structure includes forming the opening through the shallow trench isolation structure.

4. A semiconductor structure, comprising:
   a device substrate having a front side and a back side;
   an interconnect structure disposed on the front side of the device substrate; and
   a bonding pad connected to the interconnect structure, wherein the bonding pad comprises:
      a recessed region in a dielectric material layer, wherein the recessed region comprises a first trench and a second trench formed in the dielectric material layer;
      a dielectric mesa of the dielectric material layer interposed between the recessed region, wherein the dielectric mesa is interposed between the first and second trenches; and
      a metal layer disposed in the recessed region and on the dielectric mesa.

5. The semiconductor structure of claim 1, wherein the first and second trenches surround the dielectric mesa.

6. The semiconductor structure of claim 1, wherein the metal layer comprises aluminum copper alloy.

7. The semiconductor structure of claim 1, wherein the metal layer contacts a metal feature of the interconnection structure within the recessed region.

8. The semiconductor structure of claim 7, wherein the dielectric material layer comprises:
- an interlayer dielectric layer (ILD) adjacent the metal feature; and
- a trench isolation feature adjacent the ILD.

9. The semiconductor structure of claim 8, wherein the first and second trenches extend through the trench isolation feature and the ILD.

10. The semiconductor structure of claim 7, wherein the metal feature comprises a metal line in a metal one layer.

11. The semiconductor structure of claim 1, wherein the dielectric material layer comprises silicon oxide.

12. The semiconductor structure of claim 1, further comprising a bonding ball disposed on the metal layer and substantially landing on a portion of the metal layer within the dielectric mesa.

13. The semiconductor structure of claim 1, further comprising
- a radiation sensing region comprising a backside illumination sensor disposed in the front side of the device substrate, the backside illumination sensor being operable to sense radiation projected toward the radiation-sensing region from the back side of the device substrate;
- a radiation shield region adjacent the radiation sensing region and having a shield feature that comprises metal and is disposed on the back side of the device substrate; and
- a bonding region comprising the bonding pad.

14. The semiconductor structure of claim 13, further comprising:
- a passivation layer disposed on the front side of the device substrate, wherein
- the passivation layer is formed in the first and second trenches and on the dielectric mesa, and
- the passivation layer is formed on the radiation shield feature.

15. The method of claim 4, wherein a sidewall of the first trench is defined by a first sidewall of the dielectric mesa and a sidewall of the second trench is defined by a second sidewall of the dielectric mesa that opposes the first sidewall of the dielectric mesa.

16. The method of claim 15, wherein the metal layer is disposed on the first and second sidewalls of the dielectric mesa and on a topmost surface of the dielectric mesa, the topmost surface of the dielectric mesa positioned between the first and second sidewalls of the dielectric mesa.

17. A semiconductor structure, comprising:
- a semiconductor substrate having a radiation sensing region and a bonding region and having a front side and a back side;
- a radiation sensor formed in the back side of the semiconductor substrate within the radiation sensing region;
- an interconnect structure disposed on the front side of the semiconductor substrate and coupling the radiation sensor to a metal feature of the interconnect structure in the bonding region;
- a carrier substrate bonded to the front side of the semiconductor substrate with the interconnect structure sandwiched between the semiconductor substrate and the carrier substrate;
- an opening on the back side of the semiconductor substrate, wherein the opening is formed in the bonding region, extends through a dielectric material layer to the metal feature of the interconnect structure, and defines a dielectric mesa of the dielectric material layer overlying the metal feature, wherein the opening includes a first trench adjacent a first sidewall of the dielectric mesa and a second trench adjacent a second sidewall of the dielectric mesa, wherein the first sidewall of the dielectric mesa opposes the second sidewall of the dielectric mesa; and
- a metal layer partially filling the opening on the back side of the semiconductor substrate in the bonding region, wherein the metal layer has direct contact with the metal feature of the interconnect structure and further extends to the dielectric mesa.

18. The semiconductor structure of claim 17 further comprising a bonding ball landing on the metal layer and vertically aligned with the dielectric mesa, wherein the radiation sensor comprises a backside illumination imaging sensor.

19. The semiconductor structure of claim 17, wherein the dielectric mesa is interposed between the first and second trenches.

20. The semiconductor structure of claim 17, further comprising:
- a passivation layer disposed on the backside of the semiconductor substrate, disposed in the opening of the dielectric layer and including an opening, wherein the opening of the passivation layer is aligned with the dielectric mesa and exposes the dielectric mesa.

* * * * *